(12) United States Patent
Kishimoto et al.

(10) Patent No.: US 7,088,591 B2
(45) Date of Patent: Aug. 8, 2006

(54) PRINTED CIRCUIT BOARD AND METHOD FOR INSTALLING PRINTED CIRCUIT BOARD ONTO ELECTRO-CONDUCTIVE HOUSING

(75) Inventors: Tadao Kishimoto, Hachioji (JP); Yutaka Igarashi, Hachioji (JP); Hironobu Hirayama, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 297 days.

(21) Appl. No.: 10/695,463

(22) Filed: Oct. 28, 2003

(65) Prior Publication Data
US 2004/0090748 A1 May 13, 2004

(30) Foreign Application Priority Data
Nov. 6, 2002 (JP) .............................. 2002-322327

(51) Int. Cl.
H05K 7/06 (2006.01)
H05K 9/00 (2006.01)

(52) U.S. Cl. ...................... 361/753; 361/780; 361/794; 361/818; 29/846

(58) Field of Classification Search ...................... None
See application file for complete search history.

(56) References Cited

U.S. PATENT DOCUMENTS

| | | | |
|---|---|---|---|
| 5,355,105 A | 10/1994 | Angelucci, Sr. | |
| 5,376,759 A | 12/1994 | Marx et al. | |
| 5,500,789 A | 3/1996 | Miller et al. | |
| 5,966,294 A * | 10/1999 | Harada et al. | 361/794 |
| 6,198,362 B1 * | 3/2001 | Harada et al. | 333/12 |
| 6,706,964 B1 * | 3/2004 | Igarashi et al. | 174/35 R |
| 2002/0176236 A1 * | 11/2002 | Iguchi et al. | 361/753 |

FOREIGN PATENT DOCUMENTS

| | | |
|---|---|---|
| EP | 0 429 037 A1 | 5/1991 |
| JP | 2000-183533 A | 6/2000 |
| JP | 2001-210922 A | 8/2001 |

* cited by examiner

*Primary Examiner*—John B. Vigushin
(74) *Attorney, Agent, or Firm*—Frishauf, Holtz, Goodman & Chick, P.C.

(57) ABSTRACT

There is described a multi-layer printed circuit board and a method of installing it. The circuit board includes a first signal layer formed on its obverse surface; a ground layer arranged at a position next to the first signal layer; an electronic power source layer arranged at a position next to the ground layer; and a second signal layer formed on its reverse surface. The first and second patterns are formed around peripheral areas of the first and second signal layers, respectively. The first ground pattern and the second ground pattern are electrically coupled to each other by plural through holes, and the multi-layer printed circuit board is installed on an electro-conductive housing in such a manner that a substantially whole area of the second ground pattern electrically contacts a mounting area of the electro-conductive housing, the mounting area being an electro-conductive area continuously coupled to the electro-conductive housing.

11 Claims, 10 Drawing Sheets

FIG. 1 (a)

PRIOR ART

FIG. 1 (b)

PRIOR ART

FIG. 2

PRIOR ART

INSTALLATION POINT
PRINTED CIRCUIT BOARD
THROUGH HOLE

FIG. 3

PRIOR ART

CONNECTING POINT
PRINTED CIRCUIT BOARD

PRINTED CIRCUIT BOARD AND METHOD FOR INSTALLING PRINTED CIRCUIT BOARD ONTO ELECTRO-CONDUCTIVE HOUSING

BACKGROUND OF THE INVENTION

The present invention relates to a method of installing a printed circuit board onto an electro-conductive housing, so as to prevent the printed circuit board from emitting electromagnetic wave noise.

Figure 1A:
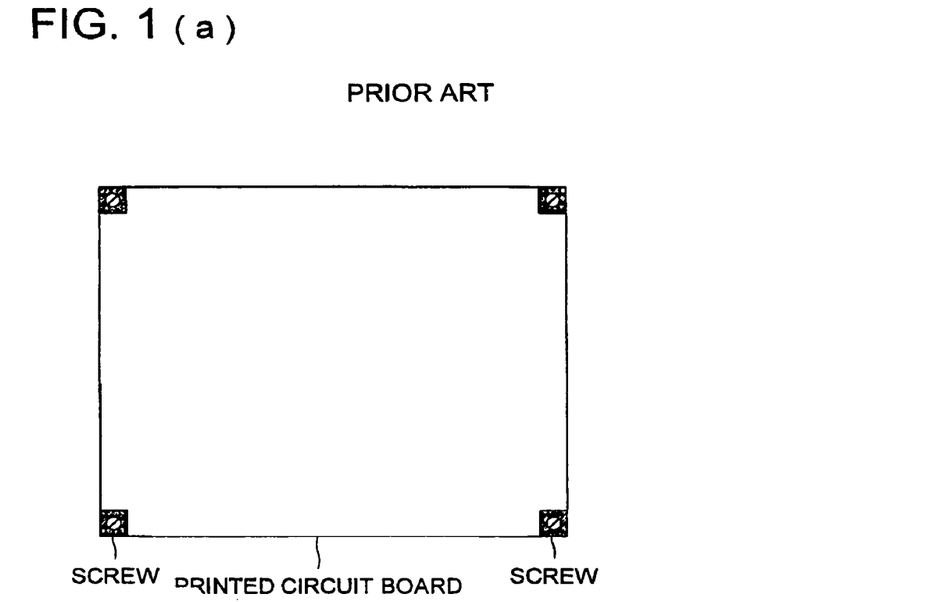
Figure 1B:
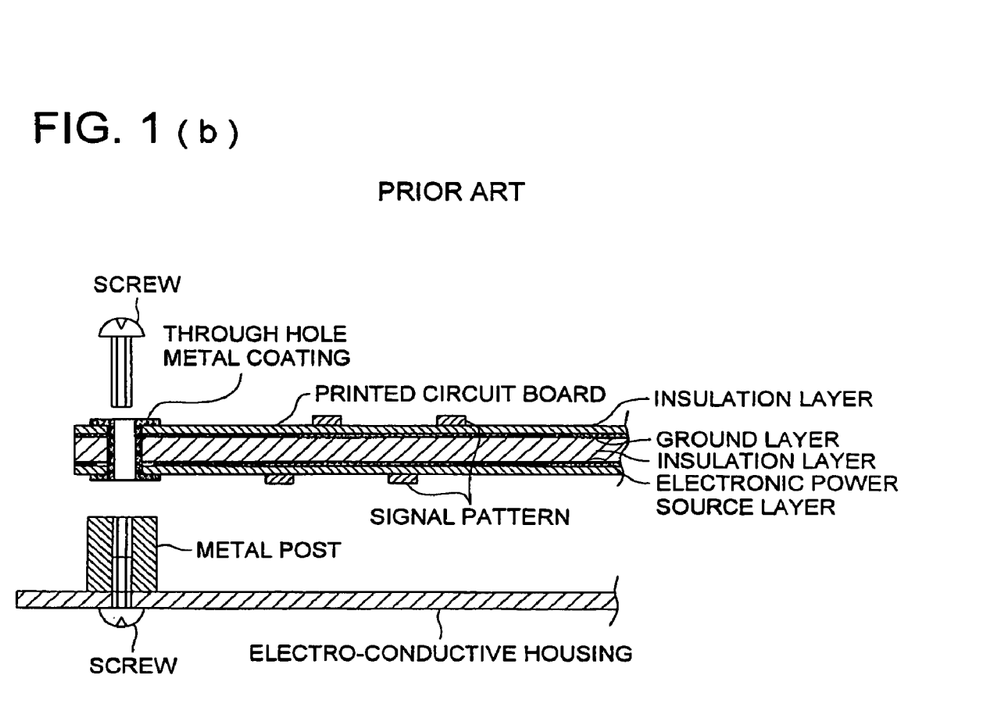

FIG. 1(a) and FIG. 1(b) show a conventional method for installing a printed circuit board onto an electro-conductive housing. In order to reduce an electromagnetic wave noise (EMI) emitted from the printed circuit board, the ground pattern formed on a signal layer of the printed circuit board is electrically coupled to the electro-conductive housing of the electronic apparatus.

As shown in the plan view of FIG. 1(a), the conventional printed circuit board is mounted onto the electro-conductive housing by fastening four metal screws through the installation holes located at the four corners of the printed circuit board.

FIG. 1(b) shows a cross sectional view of the installation hole and its peripheral. Since the inner surface of the installation hole is treated with a through-hole metal coating, the ground pattern of the signal layer on the obverse surface and the inner ground layer in the printed circuit board are electrically coupled to the metal post.

Figure 2:
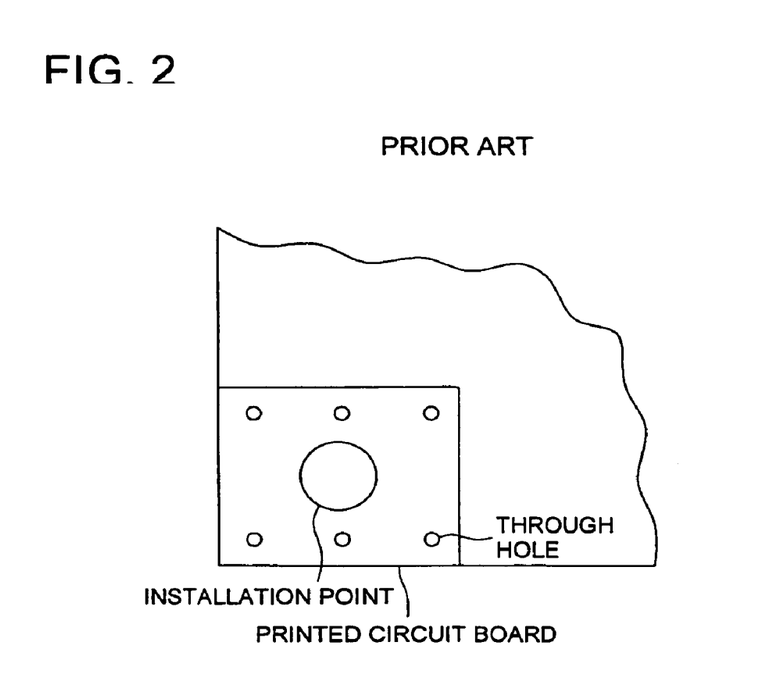
FIG. 2 shows a partial plain view of the printed circuit board, in which the inner surface of the installation hole is finished without a through-hole metal coating.

FIG. 2 shows a partial plain view of the printed circuit board, in which the inner surface of the installation hole is finished without a through-hole metal coating. In this configuration, the ground pattern of the signal layer on the obverse surface is coupled to the inner ground layer by forming a lot of through holes around the periphery of the installation hole.

Figure 3:
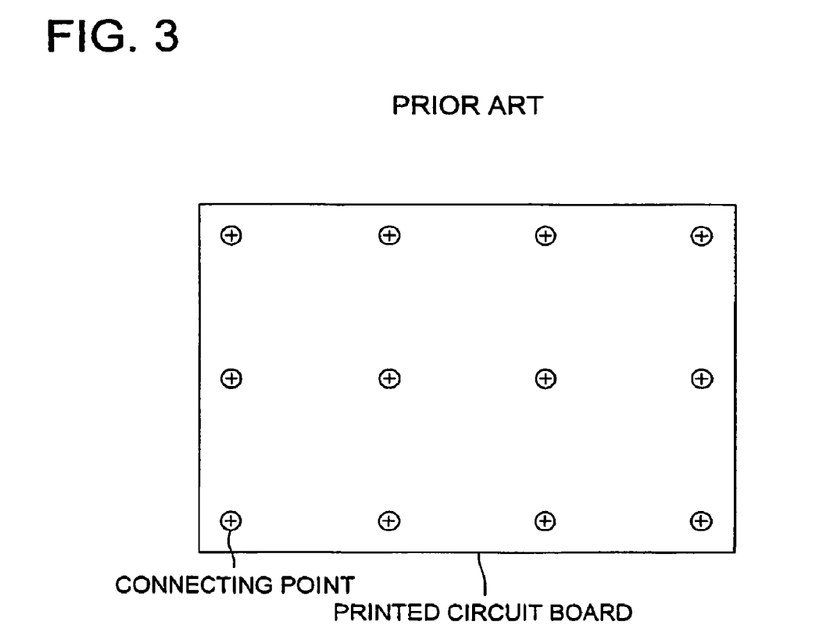
FIG. 3 shows a plain view of the printed circuit board.

As shown in a plain view of the printed circuit board shown in FIG. 3, it has been well known as a conventional technique to increase a number of connecting points between the printed circuit board and the electro-conductive housing, in order to improve an electro-magnetic noise reduction effect.

The electro-magnetic noise reduction effect caused by connecting the ground pattern of the signal layer on the printed circuit board to the electro-conductivity housing lays on the two reasons described as follow:
(1) Since the area of the ground pattern in the signal layer equivalently increases, a capacitance between the ground layer and the earth would increase, resulting in a reduction of voltage fluctuations on the ground layer.
(2) In the printed circuit board having more than four layers, a power source layer, the ground layer and the electro-conductive housing are laminated in an order of the ground layer, the power source layer and the electro-conductive housing. Accordingly, since the power source layer is structurally shielded by the two other layers, the electro-magnetic noises emitted from the gap between the power source layer and the ground layer are reduced. The lager the number of installation points is, the grater the shielding effect is, resulting in a further noise reduction.

By connecting the ground layer of the printed circuit board to the electro-conductive housing, however, sometimes the electromagnetic noises adversely increase. The reasons of this will be detailed in the following.

Figure 4:
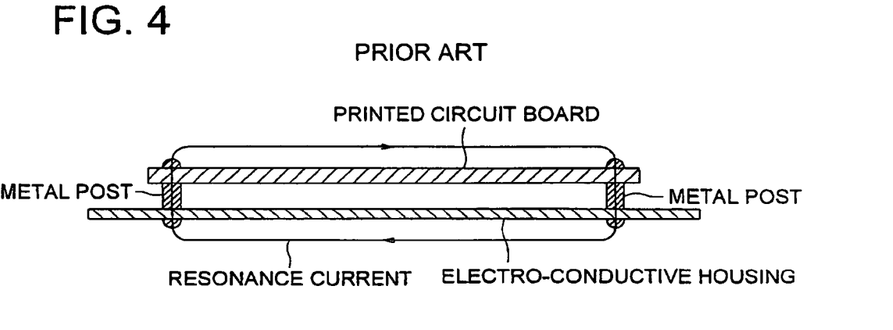
FIG. 4 is a schematic view, which shows the state that a printed circuit board is installed on the electro-conductive housing.

FIG. 4 is a schematic view, which shows the state that a printed circuit board is installed on the electro-conductive housing.

As shown in FIG. 4, by connecting the ground layer of the printed circuit board to the electro-conductive housing, a resonance would occur in the loop between connecting points. Accordingly, for instance, when the printed circuit board is mounted on the electro-conductive housing by employing the screws arranged in intervals of every 15 cm, the loop distance becomes 30 cm, resulting in the resonance at 1 GHz. Therefore, the noise reduction effect at this frequency cannot be exhibited, but the electro-magnetic noise component residing at this frequency would be adversely emphasized, possibly resulting in an occurrence of great amount of electromagnetic noises.

Generally speaking, since harmonics of clock signals mainly comprise odd-number harmonic components and the energy included in up to ninth harmonics is great, it should be prevented that the resonance occurs at the tenth harmonic frequency component.

In late years, since the clock frequency becomes high and the clock frequency of 100 MHz is generally employed in computer apparatus, it is necessary to set the resonance frequency larger than 1 GHz. To attain this goal, it is necessary to connect the printed circuit board to the electro-conductive housing at an interval smaller than 15 cm. (references: "EMC Design of Print Circuit", published by Ohmsha)

The technology for solving the abovementioned problem is also set forth in Tokkai 2000-183533.

According to the abovementioned technology, since the ground layers are disposed at upper and lower sides of the power supply layer of the multi-layer printed circuit board, and the upper and lower ground layer are coupled to each other through the through holes established at an outer circumferential area of the power supply layer, the electromagnetic noises emitted from a gap between the power supply layer and the ground layer can be reduced. However, when this technology is applied to the normal 4-layer printed circuit board, additional layers for the ground layers are necessary and, as a result, a 6-layer printed circuit board would be required. This fact is disadvantageous for its cost reduction aspect.

Further, another technology for improvement is set forth in Tokkai 2001-210922. This technology employs the electro-conductive housing, instead of the second ground layer set forth in Tokkai 2000-210922. According to this technology, in order to connect the ground to the electro-conductive housing, the ground pattern is continuously formed along the outer circumferential area of the outer layer of the printed circuit board, and is coupled to the ground of the inner layer through a lot of through holes, so that the power supply layer is electronically shielded by continuously coupling the ground pattern located at the outer circumferential area to the electro-conductive housing with a metal post or a metal plate. This is a superior technology, which effectively utilizes the electro-conductive housing for the low-cost 4-layer printed circuit board to have the same effect as set forth in Tokkai 2000-210922.

Patent Document 1: Tokkai 2000-183533, Scope of the claims

Patent Document 2: Tokkai 2001-210922, Scope of the claims

Non-Patent Document 1: "EMC Design of Printed Circuit Board" published by ohm publishing Co., LTD.

The prior art of "PRINTED WIRING BOARD AND PRINTED WIRING BOARD IMPLEMENTATION STRUCTURE" set forth in Tokkai 2001-210922 would be an effective technology when the size of the housing is approximately equal to that of the printed wiring board, but is insufficient for the printed circuit board mounted on a big housing.

Figure 5:
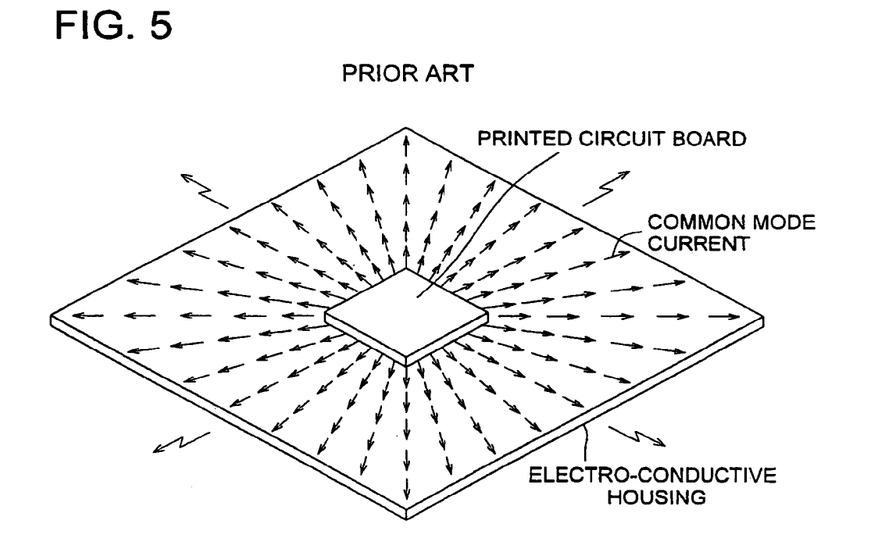
FIG. 5 shows a figure explaining an outflow of a common mode electric current caused by resonance.
Figure 6:
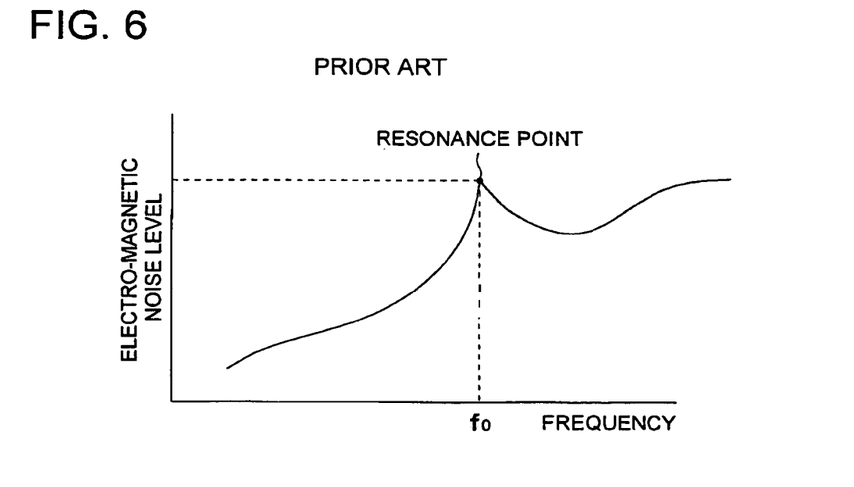
FIG. 6 shows a characteristic curve of the electro-magnetic noise level versus frequency.

FIG. 5 shows a figure explaining an outflow of a common mode electric current caused by resonance. FIG. 6 shows a characteristic curve of the electromagnetic noise level versus frequency.

Even if the whole outer circumferential area of printed circuit board is connected to the electro-conductive housing, when the size of the housing is larger than that of printed circuit board as shown in FIG. 5, a resonance phenomenon is generated at a specific frequency $f_0$ by the common mode electric current flowing on the outer surface of the electro-conductive housing as shown in FIG. 6, resulting in a cause of the electro-magnetic noises. In other words, although the electro-magnetic noise emission from the gap between the power supply layer and the ground layer can be eliminated, it is impossible to prevent the electromagnetic noise emission caused by the common mode electric current flowing in the electro-conductive housing itself.

SUMMARY OF THE INVENTION

To overcome the abovementioned drawbacks in conventional technologies, it is an object of the present invention to provide a technology, which make it possible to not only reduce electromagnetic noises emitted from the gap between the power supply layer and the signal layer, but also simultaneously prevent the common mode electric current flowing in the electro-conductive housing.

Accordingly, to overcome the cited shortcomings, the abovementioned object of the present invention can be attained by multi-layer printed circuit boards and installing methods described as follow.

(1) A multi-layer printed circuit board for mounting electronic parts on it, comprising: a first signal layer formed on an obverse surface of the multi-layer printed circuit board; a ground layer arranged at a position next to the first signal layer; an electronic power source layer arranged at a position next to the ground layer; and a second signal layer formed on a reverse surface of the multi-layer printed circuit board; wherein a first ground pattern is formed around a peripheral area of the first signal layer, while a second ground pattern is formed around a peripheral area of the second signal layer; and wherein the first ground pattern and the second ground pattern are electrically coupled to each other by a plurality of through holes, and the multi-layer printed circuit board is installed on an electro-conductive housing in such a manner that a substantially whole area of the second ground pattern electrically contacts a mounting area of the electro-conductive housing, the mounting area being an electro-conductive area continuously coupled to the electro-conductive housing.

(2) The multi-layer printed circuit board of item 1, wherein a snubber circuit, being a serial connection of a resistor and capacitor, is coupled between the ground layer and the electronic power source layer.

(3) A method for installing a multi-layer printed circuit board on an electro-conductive housing, the multi-layer printed circuit, on which electronic parts are mounted, comprising a first signal layer formed on an obverse surface of the multi-layer printed circuit board, a ground layer arranged at a position next to the first signal layer, an electronic power source layer arranged at a position next to the ground layer, and a second signal layer formed on a reverse surface of the multi-layer printed circuit board, the method comprising the steps of: forming a first ground pattern around a peripheral area of the first signal layer; forming a second ground pattern around a peripheral area of the second signal layer; coupling electrically the first ground pattern to the second ground pattern with a plurality of through holes; and mounting the multi-layer printed circuit board on a mounting area of the electro-conductive housing in such a manner that a substantially whole area of the second ground pattern electrically contacts the mounting area of the electro-conductive housing, the mounting area being an electro-conductive area continuously coupled to the electro-conductive housing.

(4) The method of item 3, wherein the mounting area of the electro-conductive housing is formed in a protruded shape, so that the electronic parts are held by the multi-layer printed circuit board without physically touching the electro-conductive housing.

(5) The method of item 3, wherein an inner area surrounded by the mounting area of the electro-conductive housing is formed in a concaved shape, so that the electronic parts are held by the multi-layer printed circuit board without physically touching the electro-conductive housing, and the inner area is opposed against the reverse surface of the multi-layer printed circuit board.

(6) The method of item 3, wherein a part of an inner area surrounded by the mounting area of the electro-conductive housing is formed in a concaved shape, so that an electronic part, being one of the electronic parts, is held by the multi-layer printed circuit board without physically touching the electro-conductive housing, and the inner area is opposed against the reverse surface of the multi-layer printed circuit board.

(7) The method of item 3, wherein an inner area surrounded by the mounting area of the electro-conductive housing is a flat plane continued from the mounting area, so that the multi-layer printed circuit board is mounted on the electro-conductive housing with a insulation layer between the inner area and the flat plane, and the inner area is opposed against the reverse surface of the multi-layer printed circuit board.

(8) A method for installing a multi-layer printed circuit board on an electro-conductive housing, the multi-layer printed circuit, on which electronic parts are mounted, comprising a first signal layer formed on an obverse surface of the multi-layer printed circuit board, a ground layer arranged at a position next to the first signal layer, an electronic power source layer arranged at a position next to the ground layer, and a second signal layer formed on a reverse surface of the multi-layer printed circuit board, the method comprising the steps of: forming a first ground pattern around a peripheral area of the first signal layer; forming a second ground pattern around a peripheral area of the second signal layer; coupling electrically the first ground pattern to the second ground pattern with a plurality of through holes; and mounting the multi-layer printed circuit board on a mounting area of the electro-conductive housing in such a manner that a substantially whole area of the first ground pattern is electrically coupled to the electro-conductive housing through an electro-conductive member.

(9) The method of item 8, wherein the multi-layer printed circuit board is held between the electro-conductive member and the electro-conductive housing by fastening them with screws, so that the electro-conductive member press-contacts the first ground pattern while press-contacting the electro-conductive housing.

(10) The method of item 8, wherein an inner area surrounded by the mounting area of the electro-conductive housing is formed in a concaved shape, so that the electronic parts are held by the multi-layer printed circuit board without physically touching the electro-conductive housing, and the inner area is opposed against the reverse surface of the multi-layer printed circuit board.

(11) The method of item 8, wherein a part of an inner area surrounded by the mounting area of the electro-conductive housing is formed in a concaved shape, so that an electronic part, being one of the electronic parts, is held by the multi-layer printed circuit board without physically touching the electro-conductive housing, and the inner area is opposed against the reverse surface of the multi-layer printed circuit board.

(12) The method of item 8, wherein an inner area surrounded by the mounting area of the electro-conductive housing is a flat plane continued from the mounting area, so that the multi-layer printed circuit board is mounted on the electro-conductive housing with a insulation layer between the inner area and the flat plane, and the inner area is opposed against the reverse surface of the multi-layer printed circuit board.

Further, to overcome the abovementioned problems, other printed circuit boards and installation methods, embodied in the present invention, will be described as follow:

(13) A printed circuit board, characterized in that, in the printed circuit board that has at least a ground layer and an electronic power source layer and mounts electronic parts, (a) an order of layer structure of a multi-layer printed circuit board having equal to or more than four layers and signal layers on obverse and reverse surfaces is structured in an order of an outer signal layer, a ground layer, an electronic power source layer, and a signal layer at an electro-conductive housing side, (b) a ground pattern is formed along a circumferential area of each of the signal layers, and the electro-conductive housing electrically and continuously coupled to the ground pattern with contacting surfaces to each other, (c) the ground pattern is electrically coupled to the ground layer with a plurality of through holes, and (c) the ground layer is coupled to the electronic power source layer through a snubber circuit, being a serial connection of a resister and capacitor.

(14) An installation method for installing the printed circuit board, that has at least a ground layer and an electronic power source layer and mounts electronic parts, onto an electro-conductive housing, characterized in that, (a) the structure of printed circuit board is the same as that described in item 13, (b) the ground pattern, formed along the circumferential area of the outer layer of the printed circuit board, is formed at the surface of the printed circuit board opposing to the electro-conductive housing, (c) an electro-conductive convex-shaped member is integrally formed at a portion at which the electro-conductive housing corresponds to the ground pattern of the printed circuit board, and the electronic parts mounted on the printed circuit board are held without contacting the electro-conductive housing.

(15) An installation method for installing the printed circuit board, that has at least a ground layer and an electronic power source layer and mounts electronic parts, onto an electro-conductive housing, characterized in that, (a) the structure of printed circuit board is the same as that described in item 13, (b) the ground pattern, formed along the circumferential area of the outer layer of the printed circuit board, is formed at the surface of the printed circuit board opposing to the electro-conductive housing, (c) the surface of the electro-conductive housing, opposing to the printed circuit board and corresponding to inner side of the ground pattern, is formed in a concave-shape, and the electronic parts mounted on the printed circuit board are held without contacting the electro-conductive housing.

(16) An installation method for installing the printed circuit board, that has at least a ground layer and an electronic power source layer and mounts electronic parts, onto an electro-conductive housing, characterized in that, (a) the structure of printed circuit board is the same as that described in item 13, (b) the ground pattern, formed along the circumferential area of the outer layer of the printed circuit board, is formed at the surface of the printed circuit board opposing to the electro-conductive housing, (c) in the surface of the electro-conductive housing, opposing to the printed circuit board and corresponding to inner side of the ground pattern, at least an area, near a portion at which an electronic part of the printed circuit board protrudes toward the electro-conductive housing side, is formed in a concave-shape, and the electronic parts mounted on the printed circuit board are held without contacting the electro-conductive housing.

(17) An installation method for installing the printed circuit board, that has at least a ground layer and an electronic power source layer and mounts electronic parts, onto an electro-conductive housing, characterized in that, (a) the structure of printed circuit board is the same as that described in item 13, (b) the ground pattern, formed along the circumferential area of the outer layer of the printed circuit board, is formed at the surface of the printed circuit board opposing to the electro-conductive housing, (c) the surface of the electro-conductive housing, opposing to the printed circuit board, is formed in a flat plain with a insulation layer between them, and the electronic parts mounted on the printed circuit board are held without contacting the electro-conductive housing.

(18) An installation method for installing the printed circuit board, that has at least a ground layer and an electronic power source layer and mounts electronic parts, onto an electro-conductive housing, characterized in that, (a) the structure of printed circuit board is the same as that described in item 13, and (b) the ground pattern is formed at an opposite side of a surface of the printed circuit board opposing to the electro-conductive housing, and the electro-conductive housing is coupled to the ground pattern through an electro-conductive member.

BRIEF DESCRIPTION OF THE DRAWINGS

Other objects and advantages of the present invention will become apparent upon reading the following detailed description and upon reference to the drawings in which:

FIG. 1(*a*) and FIG. 1(*b*) show a conventional method for installing a printed circuit board onto an electro-conductive housing;

FIG. 7(*a*) shows a cross-sectional view of a state that the printed circuit board is mounted on the electro-conductive housing, and FIG. 7(*b*) shows a perspective view of the electro-conductive housing connected to the printed circuit board and the electro-conductive post;

FIG. 9(*a*), FIG. 9(*b*), FIG. 9(*c*) and FIG. 9(*d*) show an exploded plan view of the printed circuit board;

FIG. 10(*a*) and FIG. 10(*b*) show schematic diagrams of the layer construction of a six-layer printed circuit board;

FIG. 11(*a*) shows a perspective view of the printed circuit board, FIG. 11(*b*) shows a plain view and FIG. 11(*c*) shows a schematic diagram of a layer structure;

FIG. 12(*a*), FIG. 12(*b*), FIG. 12(*c*) and FIG. 12(*d*) show cross sectional views of the printed circuit board mounted on the electro-conductive housing corresponding to various kinds of installing methods; and FIG. 13(*a*), FIG. 13(*b*) and FIG. 13(*c*) show cross sectional views of the printed circuit board mounted on the electro-conductive housing corresponding to other various kinds of installing methods; and FIG. 14(*a*) and FIG. 14(*b*) show a plain view and perspective view of an electro-conductive housing with electro-conductive post members, as another embodiment of the present invention.

DETAILED DESCRIPTION OF THE PREFERRED EMBODIMENT

Figure 7:
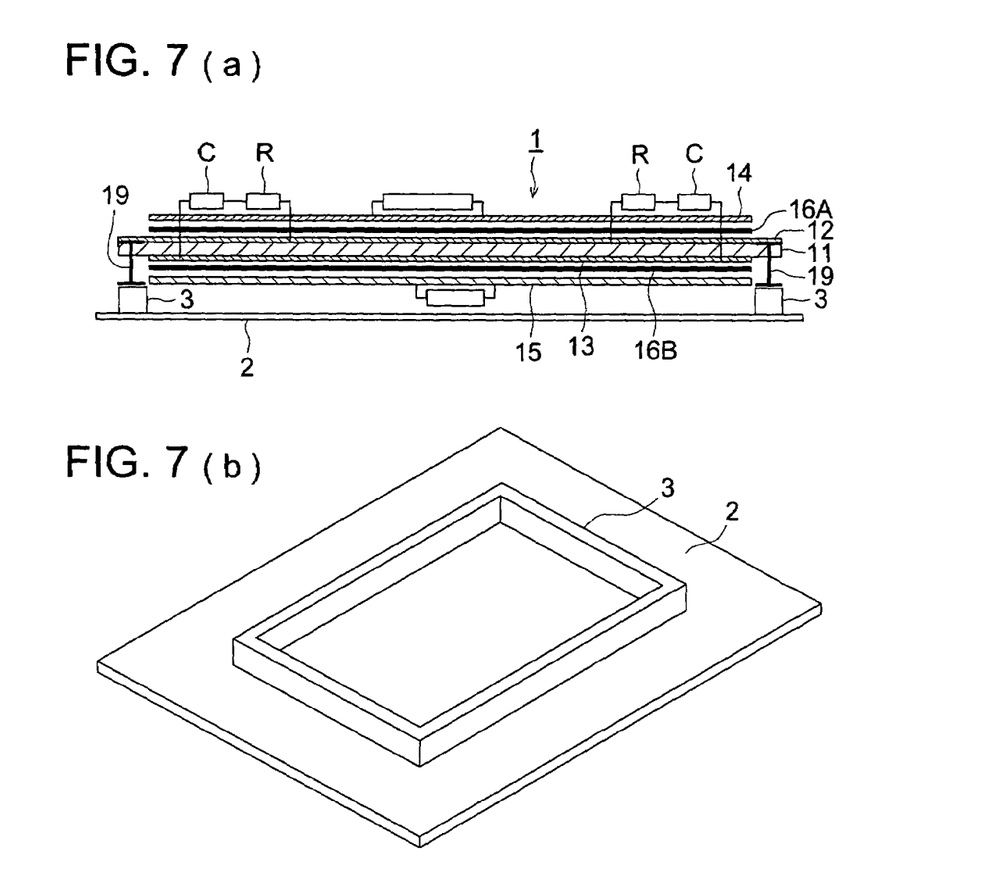

Referring to FIGS. 7(*a*)–(*b*), the preferred embodiment of the present invention will be detailed in the following.

Figure 8:
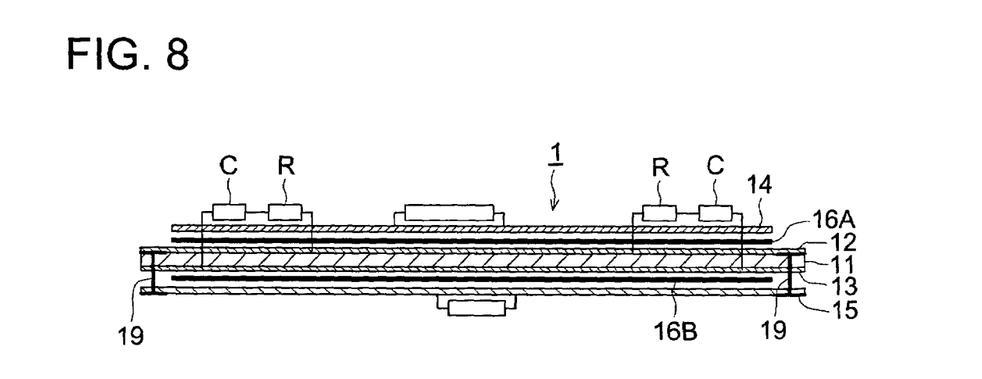
FIG. 8 shows a cross-sectional view of the printed circuit board.
Figure 9A:
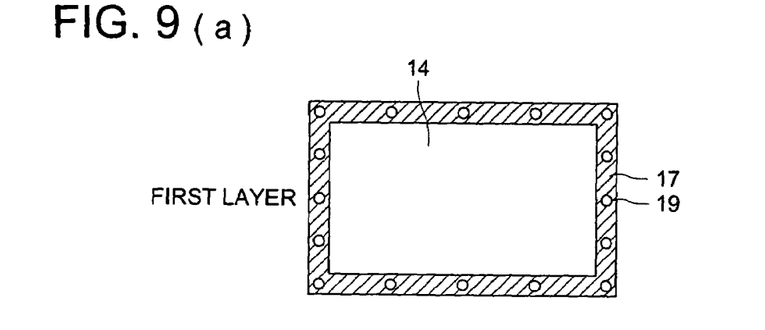
Figure 9B:
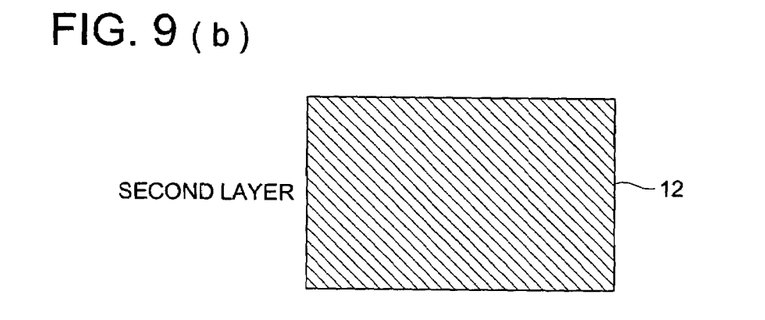
Figure 9C:
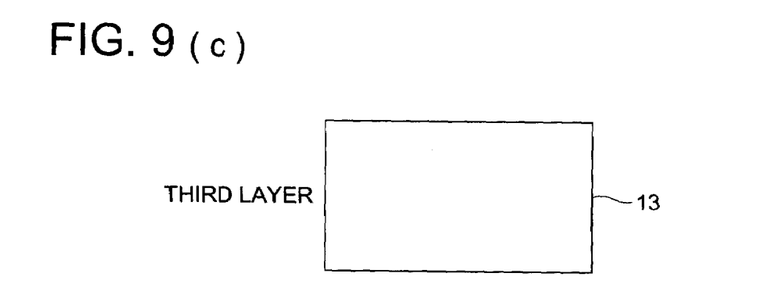
Figure 9D:
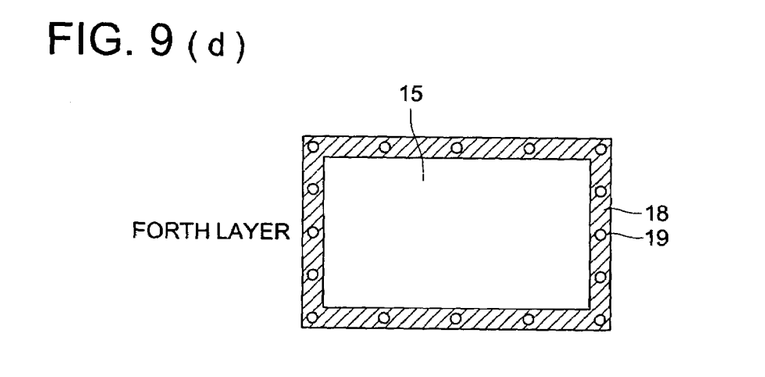

FIG. 7(*a*) shows a cross-sectional view of a state that printed circuit board 1 is mounted on electro-conductive housing 2 (hereinafter, also referred to as a housing), FIG. 7(*b*) shows a perspective view of electro-conductive housing 2 connected to printed circuit board 1 and electro-conductive post 3, FIG. 8 shows a cross-sectional view of printed circuit board 1, and FIG. 9(*a*), FIG. 9(*b*), FIG. 9(*c*) and FIG. 9(*d*) show an exploded plan view of printed circuit board 1.

The printed circuit board 1 shown in the above drawings is a four layer printed circuit board having signal layer 14, ground layer 12, power source layer 13 and signal layer 15.

Signal layer 14 is fixed at upper side of ground layer 12 with insulation sheet 16A between them in the direction shown in FIG. 7(*a*). Signal layer 15 is formed at lower side of power source layer 13 with insulation sheet 16B between them in the direction shown in FIG. 7(*a*).

The conductive area of ground layer 12 is formed as larger than that of power source layer 13. Further, signal lines from which the electro-magnetic noise emission is relatively weak, for instance, such as analogue lines, are printed on signal layer 14, while signal lines from which the electro-magnetic noise emission is relatively strong, for instance, such as clock signal lines and a bus line, are preferentially printed on signal layer 15.

Printed circuit board 1 is mounted on electro-conductive housing 2 in such a manner that the side of signal layer 15 is located directly opposite to electro-conductive housing 2.

In FIG. 7(*a*), ground pattern 17 is disposed at the circumferential area of signal layer 14 serving as a first layer, while ground pattern 18, being different from ground pattern 17, is disposed at the circumferential area of signal layer 15 serving as a fourth layer (refer to FIG. 9(*a*) and FIG. 9(*b*)).

By mounting printed circuit board 1 onto electro-conductive housing 2, ground layer 12 is electronically connected to electro-conductive housing 2 through electro-conductive post 3 (an electro-conductive protrusion-shaped member) and through holes 19 detailed later.

As shown in FIG. 7(*b*), electro-conductive post 3 is formed in a frame shape having a surface substantially the same shape as that of ground pattern 17 formed on signal layer 14.

Ground pattern 17 and ground pattern 18 are electronically connected to each other by a plurality of through holes 19. The interval distance between through holes 19 should be established at a distance shorter than 5 cm, which is ⅙ of 30 cm equivalent to the wavelength at 1 GHz, being the upper limit value defined in the standard of electromagnetic noise emission.

According to the abovementioned configuration, power source layer 13 of printed circuit board 1 and signal layer 15, on which the lines emitting relatively strong electro-magnetic noises are printed, are surrounded by ground layer 12, through holes 19 and ground pattern 18 (refer to FIGS. 9(*a*)–9(*d*)).

Accordingly, it becomes possible to suppress the electro-magnetic noise emissions from the gap between power source layer 13 and ground layer 12 and from the signal pattern of signal layer 15. The shielding effect could be improved by reducing a mounting distance of electro-conductive post 3.

Figure 10:
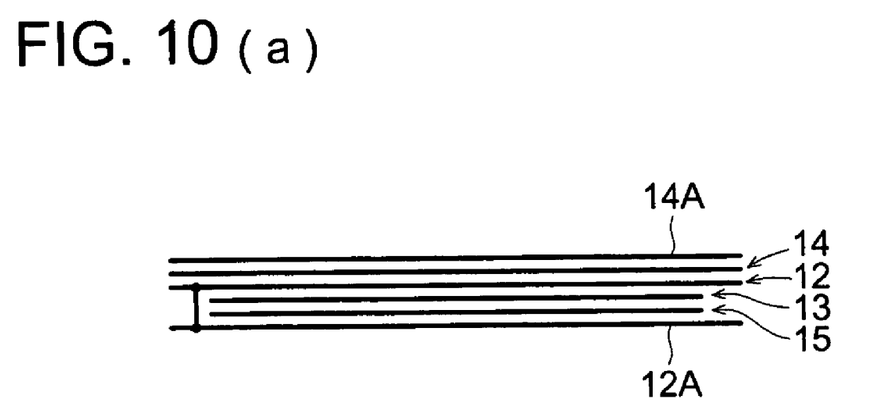

FIG. 10(*a*) and FIG. 10(*b*) show schematic diagram of the layer construction of a six-layer printed circuit board.

With respect to the six-layer printed circuit, the layer order of signal layer 14, ground layer 12, power source layer 13 and signal layer 15 is the same as that of the four-layer printed circuit board, while the layer order of second ground layer 12A and second signal layer 14A are added other than them. Since power source layer 13 is shielded by sandwiching it with signal layer 15 and electro-conductive housing 2, it becomes possible to drastically reduce the electro-magnetic noises.

Incidentally, in order to electronically conduct to electro-conductive housing 2, the solder-resist treatment is not applied to the signal pattern of signal layer 15.

Figure 11:
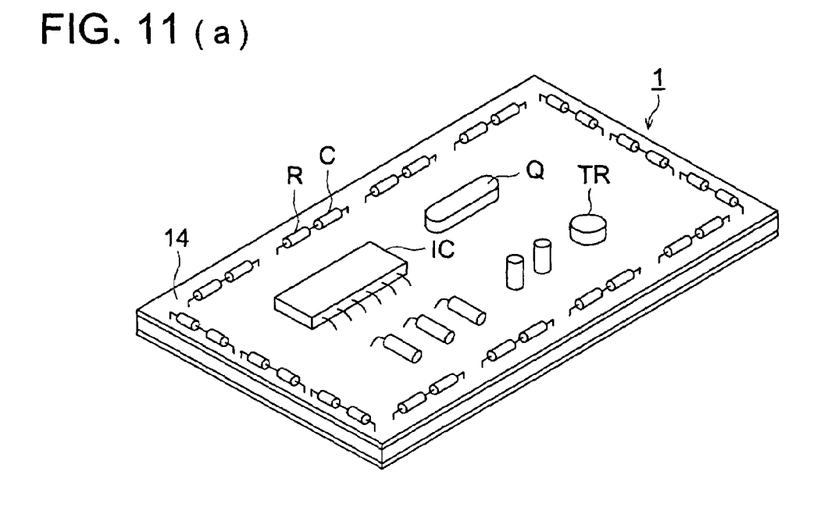
Figure 12A:
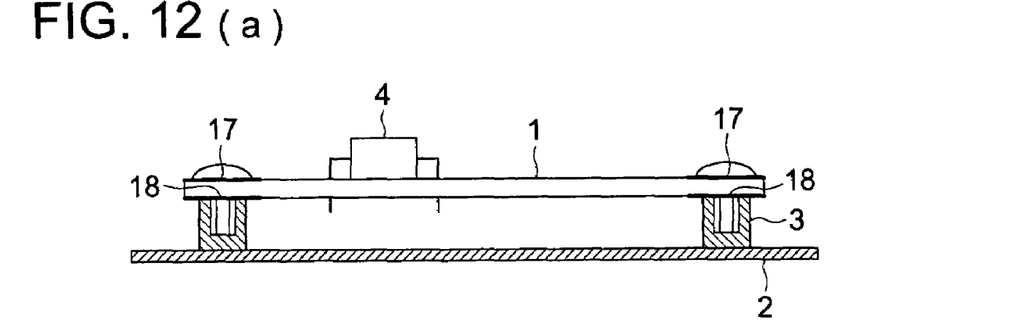
Figure 12B:
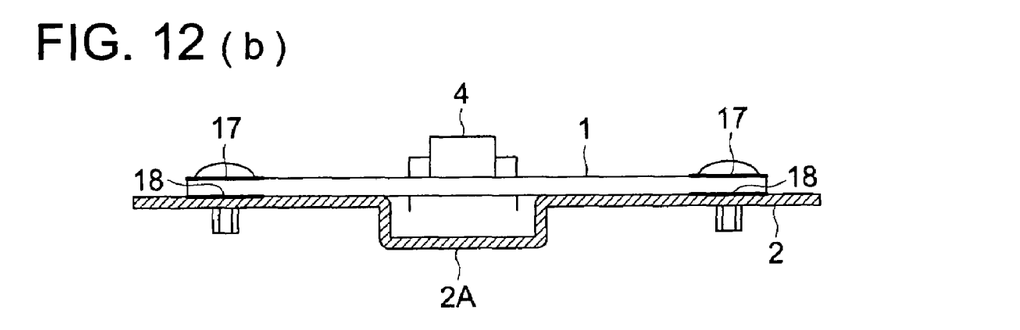
Figure 12C:
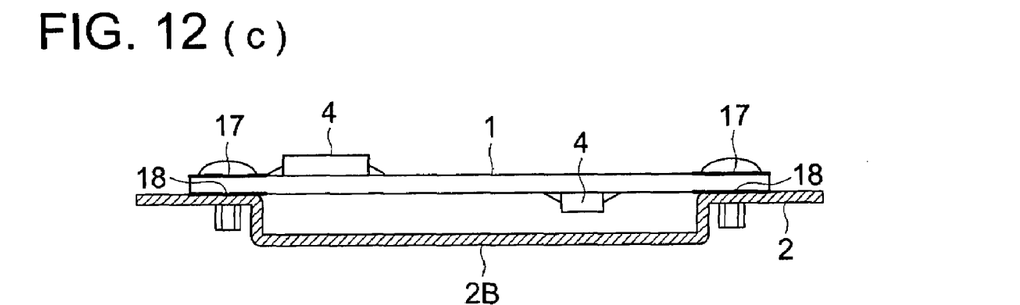
Figure 12D:
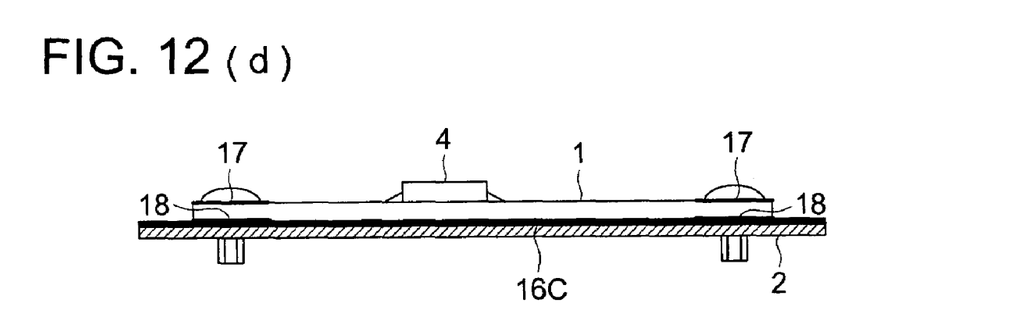

FIG. 11(*a*) shows a perspective view of printed circuit board 1, FIG. 11(*b*) shows a plain view and FIG. 11(*c*) shows a schematic diagram of a layer structure.

The electronic parts, such as integrated circuit IC, transistor TR, crystal oscillator Q for generating the clock signals, resister R, capacitor C, etc., are mounted on signal layer 14 and signal layer 15.

As shown in FIGS. 11(*a*)–11(*c*), a plurality of snubber circuits, each of which is a serial connection of resistor R and capacitor C, are mounted between power source layer 13 and signal layers 14, 15 around the circumferential area of printed circuit board 1. Generally speaking, the mounting distance between the snubber circuits is several centimeters. This snubber circuit is effective for preventing an abrupt change of the electronic current flowing into the electronic parts, resulting in a suppression of the resonance, a reduction of the common mode current flowing out from electro-conductive housing 2 and a reduction of the electro-magnetic noise emission.

FIG. 12(*a*), FIG. 12(*b*), FIG. 12(*c*) and FIG. 12(*a*) show cross sectional views of the printed circuit board mounted on electro-conductive housing 2 in various kinds of mounting structures. The connecting structure of printed circuit board 1 with electro-conductive housing 2 is not only the structure shown in FIG. 7(*a*), but also anyone of the structures shown in FIGS. 12(*a*)–12(*d*) selected depending on a presence or absence of the electronic parts mounted on the rear side of printed circuit board 1 and contents of the housing design.

FIG. 12(*a*) shows a structure in which printed circuit board 1 is mounted on electro-conductive post 3 fixed on electro-conductive housing 2. According to the abovementioned structure and the mounting method, the surface disposed opposite to printed circuit board 1 is formed in a convex shape with electro-conductive post 3, which corresponds to ground pattern 18 formed on the circumferential area of printed circuit board 1. Accordingly, printed circuit board 1 can be fixed on electro-conductive housing 2 by employing screws, etc. without contacting electronic parts 4 to electro-conductive housing 2.

FIG. 12(*b*) shows a structure in which concave section 2A is formed at the surface disposed opposite to printed circuit board 1, and located at an inner portion corresponding to ground pattern 18. According to the abovementioned structure and the mounting method, printed circuit board 1 can be fixed on electro-conductive housing 2 by employing screws, etc. without contacting electronic parts 4 to electro-conductive housing 2.

FIG. 12(*c*) shows a structure in which concave section 2B is formed at the surface disposed opposite to printed circuit board 1, and located at an inner portion surrounded by ground pattern 18. According to the abovementioned structure and the mounting method, printed circuit board 1 can be fixed on electro-conductive housing 2 by employing screws, etc. without contacting electronic parts 4 to electro-conductive housing 2.

FIG. 12(*d*) shows a structure in which a flat plane is formed at the surface disposed opposite to printed circuit board 1, and located at an inner portion continued from ground pattern 18. According to the abovementioned structure and the mounting method, printed circuit board 1 can be fixed on electro-conductive housing 2 by employing screws, etc. with insulating sheet 16C between printed circuit board 1 and electro-conductive housing 2. This structure is applicable only for a case that no electronic parts exist on signal layer 15.

In the mounting structures shown in FIGS. 12(*a*)–12(*d*), since ground pattern 18 on signal layer 15 is coupled to electro-conductive housing 2, ground pattern 17 at the circumferential area of signal layer 14 serving as a first layer is not necessary required.

Figure 13A:
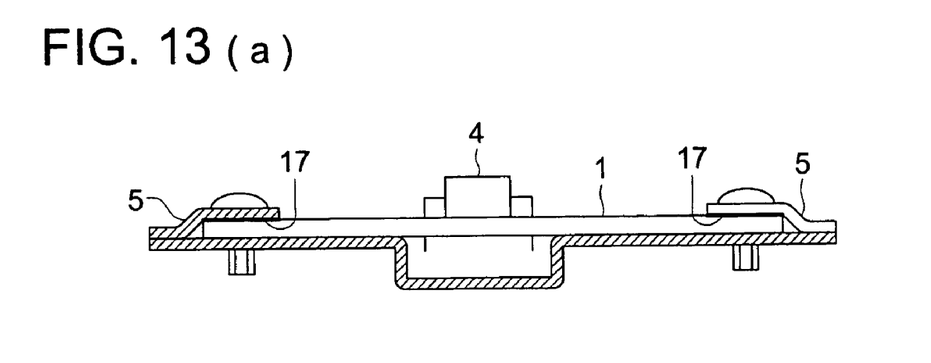
Figure 13B:
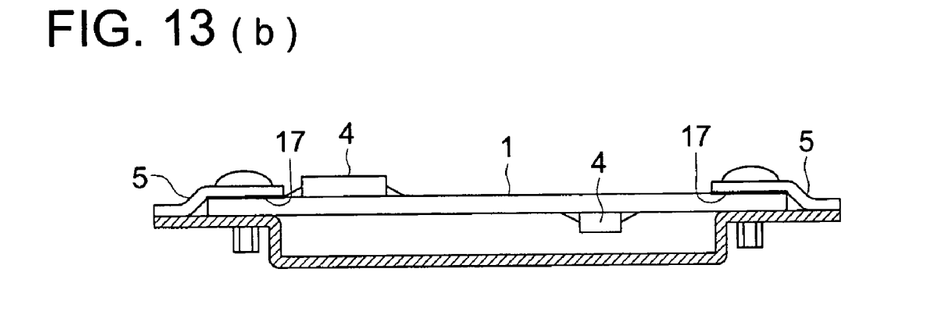
Figure 13C:
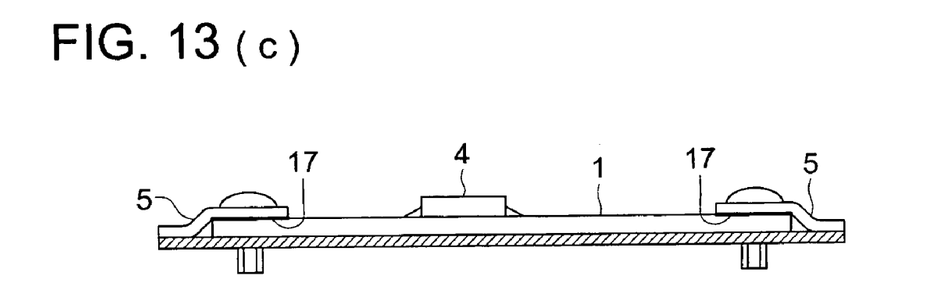

FIG. 13(*a*), FIG. 13(*b*) and FIG. 13(*c*) show cross sectional views of printed circuit board 1 mounted on the electro-conductive housing 2, indicating another embodiment of the present invention.

In the configuration shown in FIG. 13(*a*), electro-conductive housing 2 has concave section 2A in the same manner as shown in FIG. 12(*b*), and press-contacting member 5, being electro-conductive and disposed at the end portion of printed circuit board 1, press-contacts ground pattern 17 at the circumferential area of printed circuit board 1, while another end portion of press-contacting member 5 press-contacts electro-conductive housing 2, so as to electrically couples ground pattern 17 to electro-conductive housing 2.

In the configuration shown in FIG. 13(*b*), electro-conductive housing 2 has concave section 2B in the same manner as shown in FIG. 12(*c*), and press-contacting member 5, being electro-conductive and disposed at the end portion of printed circuit board 1, press-contacts ground pattern 17 at the circumferential area of printed circuit board 1, while another end portion of press-contacting member 5 press-contacts electro-conductive housing 2, so as to electrically couples ground pattern 17 to electro-conductive housing 2.

In the configuration shown in FIG. 13(*c*), electro-conductive housing 2 is a flat plane in the same manner as shown in FIG. 12(*d*), and press-contacting member 5, being electro-conductive and disposed at the end portion of printed circuit board 1, press-contacts ground pattern 17 at the circumferential area of printed circuit board 1, while another end portion of press-contacting member 5 press-contacts electro-conductive housing 2, so as to electrically couples ground pattern 17 to electro-conductive housing 2.

In the mounting structures shown in FIGS. 13(*a*)–13(*c*), since ground pattern 17 on signal layer 14 is coupled to electro-conductive housing 2 through press-contacting member 5, ground pattern 18 at the circumferential area of signal layer 15 serving as a fourth layer is not necessary required.

Figure 14:
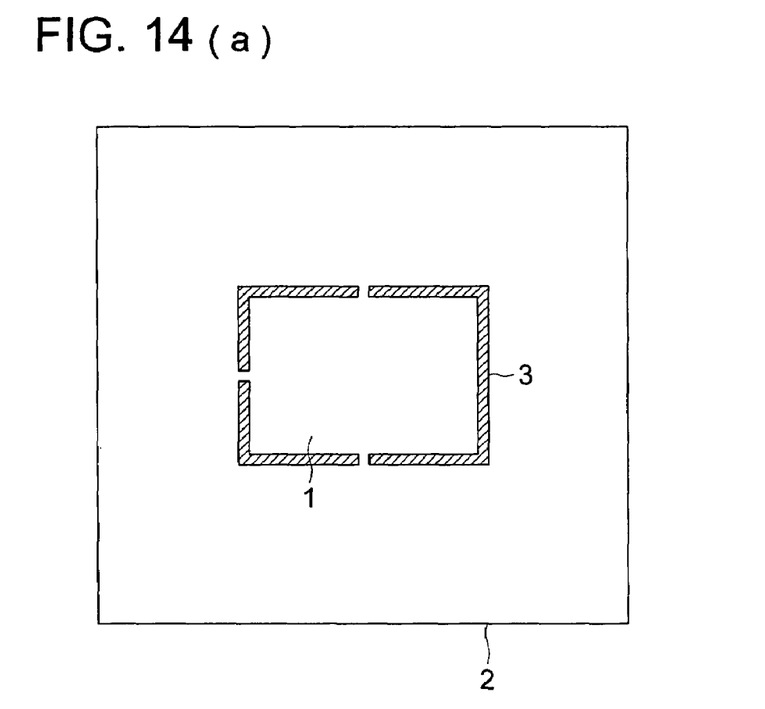

FIG. 14(a) and FIG. 14(b) show a plain view and perspective view of an electro-conductive housing with electro-conductive post members, as another embodiment of the present invention.

In the abovementioned embodiment shown in FIG. 7(a) and FIG. 7(b), electro-conductive post 3 is coupled to electro-conductive housing 2 without any slit over the whole circumferential area of printed circuit board 1. As shown in FIG. 14(b), however, even if slits 3A, which cut off a part of electro-conductive post 3 shaped in a frame, are established in it, such configuration would result in only a little deterioration of the efficiency.

According to the present invention, the following effects can be attained.

(1) By changing a connecting configuration between printed circuit board 1 and electro-conductive housing 2 from a plural points contacting mode to a line-coupling mode, it becomes possible to prevent an electro-magnetic noise emission caused by resonance current in the loop formed between the installing points.

(2) When a multi-layer printed circuit board having equal to or more than two layers is employed, by arranging the layers in an order of the signal layer, the electronic power source layer and the electro-conductive housing, and by coupling the ground pattern at circumferential area of the signal layer to the signal layer at inner layer with a lot of through holes, the electronic power source layer can be shielded, resulting in a reduction of the electromagnetic noise emission emitted from a gap between the electronic power source layer and the ground layer.

(3) By coupling the electronic power source layer power source layer to the ground layer with a plurality of snubber circuits, each being a serial connection of a resistor and a capacitor, it becomes possible to prevent not only an occurrence of the resonance between the electronic power source layer and the ground layer, but also the common mode current flowing into the electro-conductive housing, resulting in a reduction of the electromagnetic noise emission.

Disclosed embodiment can be varied by a skilled person without departing from the spirit and scope of the invention.

What is claimed is:

1. A multi-layer printed circuit board for mounting electronic parts on it, comprising:
   a first signal layer formed on an obverse surface of said multi-layer printed circuit board;
   a ground layer arranged at a position next to said first signal layer;
   an electronic power source layer arranged at a position next to said ground layer; and
   a second signal layer formed on a reverse surface of said multi-layer printed circuit board;
   wherein a first ground pattern is formed around a peripheral area of said first signal layer, while a second ground pattern is formed around a peripheral area of said second signal layer; and
   wherein said first ground pattern and said second ground pattern are electrically coupled to each other by a plurality of through holes, and said multi-layer printed circuit board is installed on an electro-conductive housing in such a manner that a substantially whole area of said second ground pattern electrically contacts a mounting area of said electro-conductive housing, said mounting area being an electro-conductive area continuously coupled to said electro-conductive housing; and
   wherein a snubber circuit, being a serial connection of a resistor and a capacitor, is coupled between said ground layer and said electronic power source layer.

2. A method for installing a multi-layer printed circuit board on an electro-conductive housing, said multi-layer printed circuit, on which electronic parts are mounted, comprising a first signal layer formed on an obverse surface of said multi-layer printed circuit board, a ground layer arranged at a position next to said first signal layer, an electronic power source layer arranged at a position next to said ground layer, and a second signal layer formed on a reverse surface of said multi-layer printed circuit board, said method comprising the steps of:
   forming a first ground pattern around a peripheral area of said first signal layer;
   forming a second ground pattern around a peripheral area of said second signal layer;
   coupling electrically said first ground pattern to said second ground pattern with a plurality of through holes;
   coupling a snubber circuit, being a serial connection of a resistor and a capacitor, between said ground layer and said electronic power source layer; and
   mounting said multi-layer printed circuit board on a mounting area of said electro-conductive housing in such a manner that a substantially whole area of said second ground pattern electrically contacts said mounting area of said electro-conductive housing, said mounting area being an electro-conductive area continuously coupled to said electro-conductive housing.

3. The method of claim 2,
   wherein said mounting area of said electro-conductive housing is formed in a protruded shape, so that said electronic parts are held by said multi-layer printed circuit board without physically touching said electro-conductive housing.

4. The method of claim 2,
   wherein an inner area surrounded by said mounting area of said electro-conductive housing is formed in a concaved shape, so that said electronic parts are held by said multi-layer printed circuit board without physically touching said electro-conductive housing, and said inner area is opposed against said reverse surface of said multi-layer printed circuit board.

5. The method of claim 2,
   wherein a part of an inner area surrounded by said mounting area of said electro-conductive housing is formed in a concaved shape, so that an electronic part, being one of said electronic parts, is held by said multi-layer printed circuit board without physically touching said electro-conductive housing, and said inner area is opposed against said reverse surface of said multi-layer printed circuit board.

6. The method of claim 2,
   wherein an inner area surrounded by said mounting area of said electro-conductive housing is a flat plane continued from said mounting area, so that said multi-layer printed circuit board is mounted on said electro-conductive housing with an insulation layer between said inner area and said multi-layer printed circuit board, and said inner area is opposed against said reverse surface of said multi-layer printed circuit board.

7. A method for installing a multi-layer printed circuit board on an electro-conductive housing, said multi-layer printed circuit, on which electronic parts are mounted, comprising a first signal layer formed on an obverse surface of said multi-layer printed circuit board, a ground layer arranged at a position next to said first signal layer, an electronic power source layer arranged at a position next to said ground layer, and a second signal layer formed on a reverse surface of said multi-layer printed circuit board, said method comprising the steps of:

forming a first ground pattern around a peripheral area of said first signal layer;

forming a second ground pattern around a peripheral area of said second signal layer;

coupling electrically said first ground pattern to said second ground pattern with a plurality of through holes;

coupling a snubber circuit, being a serial connection of a resistor and a capacitor, between said ground layer and said electronic power source layer, and mounting said multi-layer printed circuit board on a mounting area of said electro-conductive housing in such a manner that a substantially whole area of said first ground pattern is electrically coupled to said electro-conductive housing through an electro-conductive member.

8. The method of claim 7, wherein said multi-layer printed circuit board is held between said electro-conductive member and said electro-conductive housing by fastening them with screws, so that said electro-conductive member press-contacts said first ground pattern while press-contacting said electro-conductive housing.

9. The method of claim 7, wherein an inner area surrounded by said mounting area of said electro-conductive housing is formed in a concaved shape, so that said electronic parts are held by said multi-layer printed circuit board without physically touching said electro-conductive housing, and said inner area is opposed against said reverse surface of said multi-layer printed circuit board.

10. The method of claim 7, wherein a part of an inner area surrounded by said mounting area of said electro-conductive housing is formed in a concaved shape, so that an electronic part, being one of said electronic parts, is held by said multi-layer printed circuit board without physically touching said electro-conductive housing, and said inner area is opposed against said reverse surface of said multi-layer printed circuit board.

11. The method of claim 7, wherein an inner area surrounded by said mounting area of said electronic-conductive housing is a flat plane continued from said mounting area, so that said multi-layer printed circuit board is mounted on said electro-conductive housing with an insulation layer between said inner area and said multi-layer printed circuit board, and said inner area is opposed against said reverse surface of said multi-layer printed circuit board.

* * * * *